(12) United States Patent
Yu et al.

(10) Patent No.: US 12,223,205 B2
(45) Date of Patent: Feb. 11, 2025

(54) SYSTEMS, METHODS AND DEVICES FOR READING A MEMORY OF A STORAGE DEVICE

(71) Applicant: InnoGrit Technologies Co., Ltd., Shanghai (CN)

(72) Inventors: Hongsen Yu, San Jose, CA (US); Shawn Chen, San Jose, CA (US); Gang Zhao, Chandler, AZ (US); Wei Jiang, Fremont, CA (US); Lin Chen, Cupertino, CA (US)

(73) Assignee: InnoGrit Technologies Co., Ltd., Shanghai (CN)

( * ) Notice: Subject to any disclaimer, the term of this patent is extended or adjusted under 35 U.S.C. 154(b) by 7 days.

(21) Appl. No.: 18/134,266

(22) Filed: Apr. 13, 2023

(65) Prior Publication Data

US 2024/0345769 A1    Oct. 17, 2024

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G06F 13/1689; G11C 7/1051
See application file for complete search history.

(56) References Cited

U.S. PATENT DOCUMENTS

| | | | |
|---|---|---|---|
| 9,524,255 B2* | 12/2016 | Zhu | G11C 7/02 |
| 2010/0284231 A1* | 11/2010 | Park | G11C 7/1051 |
| | | | 365/233.1 |
| 2018/0136851 A1* | 5/2018 | Batra | G06F 3/0659 |
| 2018/0294999 A1* | 10/2018 | Giovannini | H04L 25/03878 |
| 2022/0383916 A1* | 12/2022 | Park | G11C 7/1063 |
| 2022/0413759 A1* | 12/2022 | Shen | G06F 13/1626 |
| 2023/0178138 A1* | 6/2023 | Nygren | G06F 1/08 |
| | | | 365/233.1 |

* cited by examiner

*Primary Examiner* — David Yi
*Assistant Examiner* — Tahilba O Puche
(74) *Attorney, Agent, or Firm* — IPro, PLLC

(57) ABSTRACT

Disclosed herein are systems, methods and devices for controlling output of a storage device during read operations. The method comprises: measuring a length of a temporal gap between first and second consecutive read bursts from a storage device, the first and second read burst are in response to first and second read commands received by the storage device, respectively; generating a state code according to the length, wherein the state code has a first value when the length is zero, a second value when the length is equal to or shorter than a threshold time length but is non-zero, and a third value when the length is greater than the threshold time length; and controlling output of the storage device according to the state code.

14 Claims, 14 Drawing Sheets

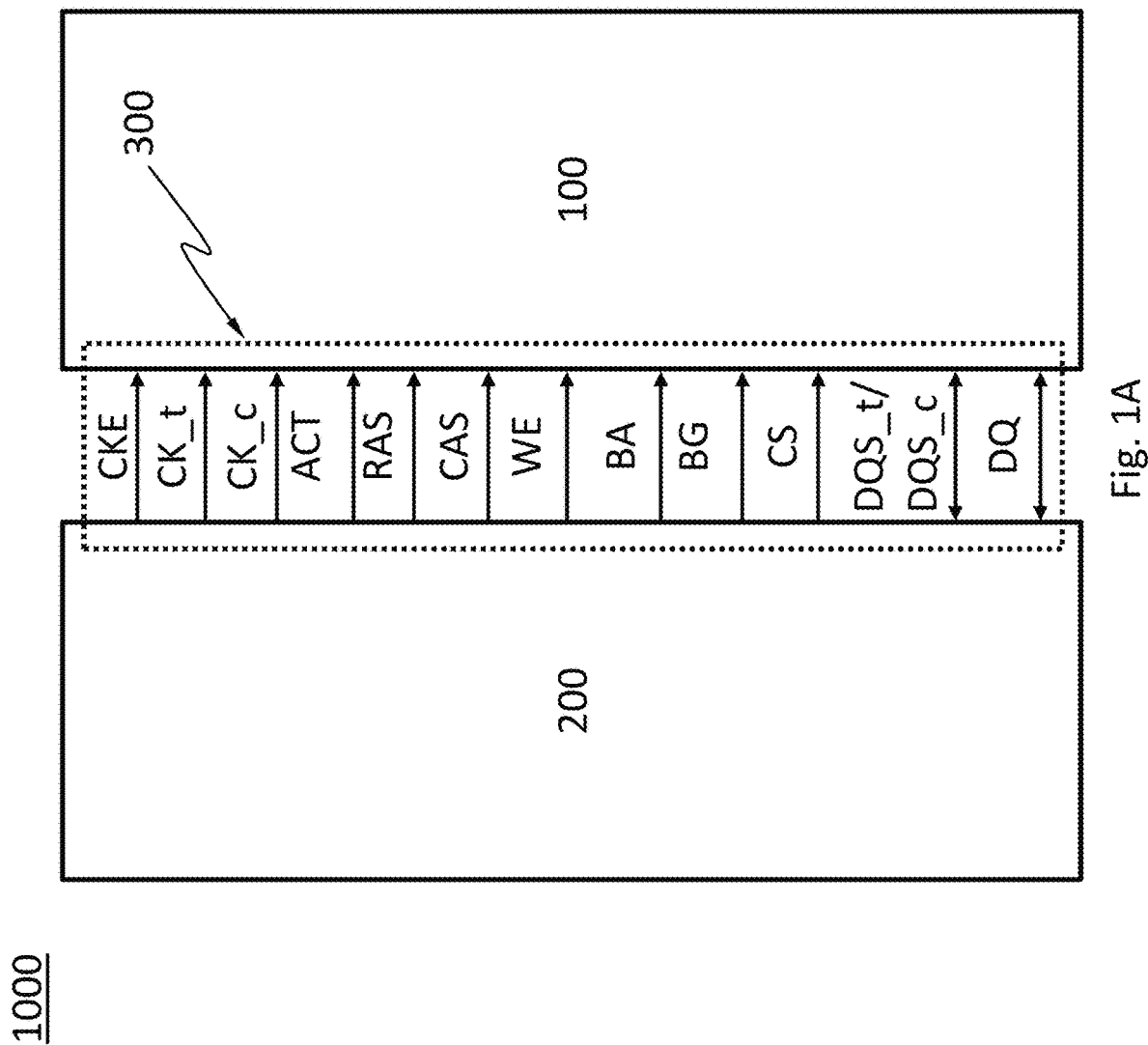

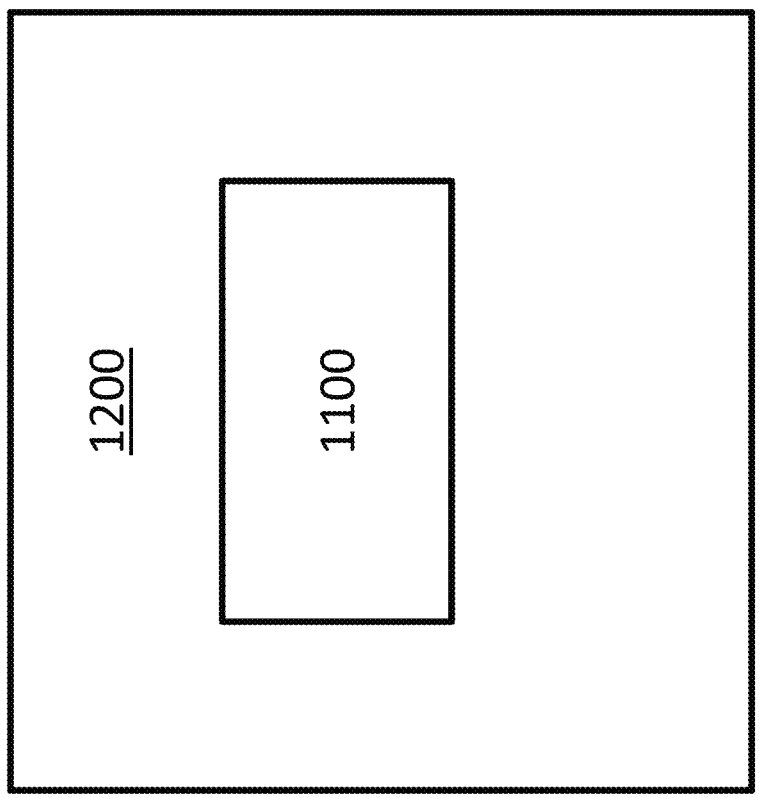

SYSTEMS, METHODS AND DEVICES FOR READING A MEMORY OF A STORAGE DEVICE

TECHNICAL FIELD

The present disclosure generally relates to storage devices, and in particular to systems, methods and devices for reading a memory of a storage device.

BACKGROUND

There are many types of dynamic random-access memory (DRAM). One type is referred to as double data rate DRAM (DDR DRAM), which makes higher transfer rates possible by more strict control of the timing of electrical data and clock signals. DDR DRAM conforms to industry standard electrical and protocol standards set forth by the Joint Electron Devices Engineering Councils (JEDEC). According to the JEDEC specification, the DDR DRAM interface utilizes a true data strobe signal (DQS_t) and a complement data strobe signal (DQS_c) to sample data (DQ). The pair of signals is also referred to as a differential signal pair. Specifically, during read operations on the DDR DRAM, a differential signal of DQS_t and DQS_c is used to sample DQ from the DDR DRAM. The differential signal pair is supplied to a differential receiver of a controller. When DQS_t and DQS_c are at different levels, a known differential signal is output from the differential receiver. When DQ is transmitted, DQS_t and DQS_c toggle differentially. However, when the interface is idle, DQS_t and DQS_c may stay at the same level, which makes them not differential. At this time, the differential receiver may have an unknown output, which could disrupt its downstream digital logic. Therefore, it is useful to gate off the output of the differential receiver (which means setting the output of differential receiver to a fixed value) when DQS_t and DQS_c are at the same level while allowing the output of the differential receiver to represent DQ when DQS_t and DQS_c toggle differentially.

A data strobe signal usually includes a programmable pre-amble portion, a data readout period, and a post-amble portion. The programmable preamble portion may provide a programmable timing window for a receiving device to enable a data capture circuit when a known/valid level is present on the signal, thereby avoiding false triggering of the data capture circuit. After the programmable preamble portion and during the data readout period, the data strobe signal switches between high and low transitions along with a clock signal to transfer data. The time after the last transition of the data readout period is called the post-amble portion. Therefore, during read operations on the DDR DRAM, DQS_t and DQS_c toggling in the pre-amble and post-amble portions is not used to sample DQ. That is, not every DQS_t or DQS_c toggling is used to sample DQ. Moreover, different DRAM protocols have different pre-amble and post-amble patterns, so that it is challenging to design a controller capable of supporting all the patterns. In order to simplify the downstream digital logic, it is useful to discard the toggling not used to sample DQ.

In addition, the DDR DRAM is often operable in a burst read mode during read operations. In the burst read mode, addresses may be generated in sequence in the DDR DRAM in response to a read command supplied to the DDR DRAM by the controller, and after the read command is received and an initial address is addressed, data will be read out in succession in response to the addresses generated internally in sequence without the need for a host to provide all addresses of the readout data. A read burst will be triggered after a read command is received by the DDR DRAM. Namely, a process of reading data with a burst length (which refers to an amount of data read out in succession from the DDR DRAM after the controller presents the read commanded to the DDR DRAM) from the DDR DRAM will be started after a read latency (which refers to a delay between the presentation of the read command and the availability of the first bit of the readout data) in response to the read command. There may be a gap between two consecutive read bursts, and the existence of the gap may cause some pre-amble portions to be chopped off or some post-amble portions to be merged. Therefore, how to gate off the unwanted output of the differential receiver becomes more difficult with the presence of the gap between read bursts.

SUMMARY

The present disclosure provides systems, methods and devices for reading a memory of a storage device, which may support different protocols with different pre-amble and post-amble patterns.

Disclosed herein is a method comprising: measuring a length of a temporal gap between a first read burst and a second read burst from a memory of a storage device, wherein the first read burst and the second read burst are consecutive, the first read burst is in response to a first read command received by the memory and the second read burst is in response to a second read command received by the memory; generating a state code according to the length, wherein the state code has a first value when the length is zero, a second value when the length is equal to or shorter than a threshold time length but is non-zero, and a third value when the length is greater than the threshold time length; and controlling output of the storage device according to the state code.

In an aspect, controlling the output comprises setting the output to a fixed value.

In an aspect, the output is from a differential receiver in the storage device.

In an aspect, the length is measured based on a temporal gap between the first read command and the second read command.

In an aspect, the method further comprises enqueuing the state code into a queue.

In an aspect, the method further comprises dequeuing the state code from the queue after controlling the output of the storage device according to the state code.

In an aspect, the memory is a flash memory or a dynamic random-access memory (DRAM).

In an aspect, the method further comprises determining a time period according to the state code and setting the output to the fixed value during the time period; wherein the time period is between the first read burst and the second read burst.

In an aspect, the output is from a differential receiver in the storage device, and the method further comprises: at each toggling of an input of the differential receiver, setting a counter to a next count value based on the state code and a current count value of the counter, wherein (A) the next count value is a length of the second read burst when the current count value is a first predefined number and the state code has the first value; (B) the next count value is the length of the second read burst plus the fixed threshold time length when the current count value is the first predefined number and the state code has the second value; (C) the next count value is a second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number. The time period begins at the end of the first read burst and ends when the next count value is not greater than the length of the second read burst and does not equal the second predefined number.

In an aspect, the length of the second read burst is 4 clock cycles or 8 clock cycles.

In an aspect, the fixed threshold time length is 1 clock cycle.

In an aspect, the first predefined number is 1 and the second predefined number is 0.

Disclosed herein is a controller configured to: measure a length of a temporal gap between a first read burst and a second read burst from a memory of a storage device, wherein the first read burst and the second read burst are consecutive, the first read burst is in response to a first read command received by the memory and the second read burst is in response to a second read command received by the memory; generate a state code according to the length, wherein the state code has a first value when the length is zero, a second value when the length is equal to or shorter than a threshold time length but is non-zero, and a third value when the length is greater than the threshold time length; and control output of the storage device according to the state code.

In an aspect, the controller is further configured to set the output to a fixed value.

In an aspect, the output is from a differential receiver in the storage device.

In an aspect, the controller is further configured to determine a time period according to the state code and set the output to the fixed value during the time period; wherein the time period is between the first read burst and the second read burst.

In an aspect, the controller comprises a counter configured to count the time period, the output is from a differential receiver in the storage device, and the controller is further configured to: at each toggling of an input of the differential receiver, set the counter to a next count value based on the state code and a current count value of the counter, wherein (A) the next count value is a length of the second read burst when the current count value is a first predefined number and the state code has the first value; (B) the next count value is the length of the second read burst plus the fixed threshold time length when the current count value is the first predefined number and the state code has the second value; (C) the next count value is a second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number. The time period begins at the end of the first read burst and ends when the next count value is not greater than the length of the second read burst and does not equal the second predefined number.

Disclosed herein is a system comprising any one of the controllers described above, wherein the system is a solid-state drive (SSD), a flash drive, a mother board, a processor, a computer, a server, a gaming device, or a mobile device.

Disclosed herein is a non-transitory machine-readable medium having information recorded thereon, wherein the information, when read by a hardware processor system, causes the hardware processor system to perform any one of the methods described above.

BRIEF DESCRIPTION OF FIGURES

FIG. 1A is a simplified block diagram of a storage device.

FIG. 13 is a block diagram of a system according to an embodiment.

DETAILED DESCRIPTION

Figure 1B:
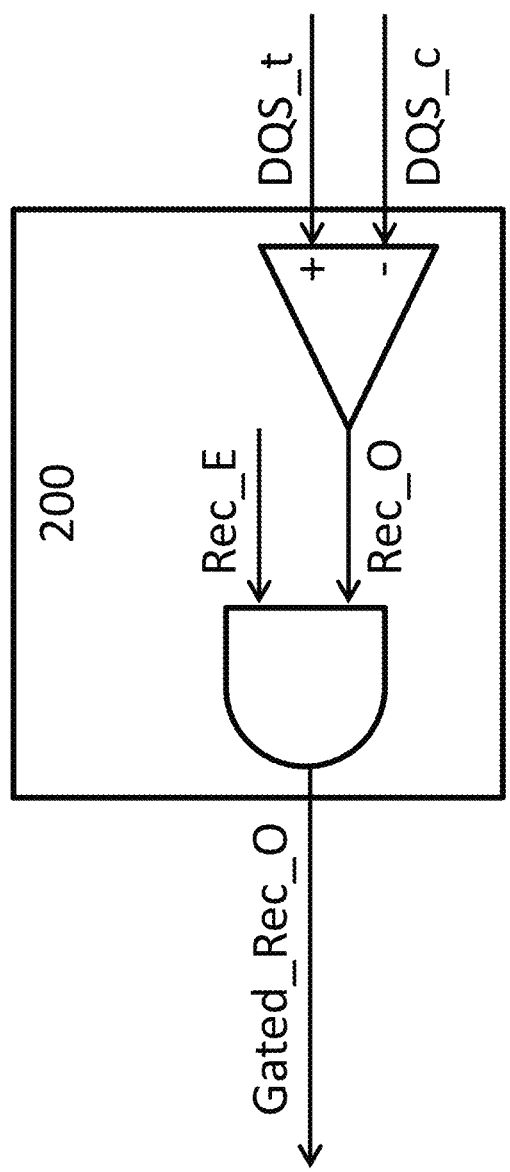
FIG. 1B is a simplified block diagram of a controller of the storage device in FIG. 1A.

Specific embodiments according to the present disclosure will now be described in detail with reference to the accompanying drawings. Like elements in various figures are denoted by like reference signs for consistency.

In order to facilitate an understanding of the present disclosure, a number of terms will be defined below before the description of the specific embodiments.

As used herein and in the appended claims, the suffixes "_t" and "_c" are used to represent the true and complement of a differential signal pair. For example, CK_t and CK_c are a pair of differential clock signals, wherein CK_t is the true clock signal, and CK_c is the complement clock signal. For another example, DQS_t and DQS_c are a pair of differential data strobe signals, wherein DQS_t is the true data strobe signal, and DQS_c is the complement data strobe signal.

As used herein and in the appended claims, the term "queue" is a collection of elements that are maintained in a sequence and can be modified by the addition of elements at one end of the sequence and the removal of elements from the other end of the sequence. By convention, the end of the sequence for adding elements may be called the rear of the queue, and the end for removing elements may be called the front of the queue, analogously to the words used when people line up to wait for goods or services. As used herein and in the appended claims, the term "enqueue" refers to an operation of adding an element to the one end (the rear) of the sequence, and the term "dequeue" refers to an operation of removing an element from the other end (the front) of the sequence. The operations of enqueuing and dequeuing cause the queue to become a first-in-first-out (FIFO) data structure in which the first element added to the queue will be the first one removed.

As used herein and in the appended claims, the term "length" refers to the number of clock cycles measured in a corresponding time period, rather than the absolute time, unless otherwise specified. As an example, a read burst length of 4 means that the read burst length is 4 clock cycles. As another example, a pre-amble length of 2 means that the pre-amble length is 2 clock cycles.

As used herein and in the appended claims, the term "read command" refers to a command issued by a controller to initiate a burst read access to a memory of a storage device.

As used herein and in the appended claims, the term "read latency" (RL) refers to a delay that may be measured in clock cycles, between the presentation of a read command and the availability of the first bit of the readout data. For example, when RL is set to 11, i.e., RL=11, data is output from a memory of a storage device 11 clock cycles after a read command is supplied to the memory of the storage device.

As used herein and in the appended claims, the term "read burst" refers to a process of reading data with a burst length in succession from a memory of storage device after the RL in response to a single read command, and the term "consecutive read bursts" refers to two read bursts between which there are no other read bursts, but they may have a temporal gap between them.

As used herein and in the appended claims, the term "burst length" refers to the amount of data read from a storage device after a single read command is presented, measured in clock cycles. For example, when the burst length is 4, data of 4 clock cycles will be read out in succession in response to a single read command.

The present disclosure provides systems, methods and devices for reading a memory of a storage device. As used herein and in the appended claims, a storage device may be any type of computing hardware that is used for storing, porting or extracting data or information. A storage device includes at least a memory. A storage device may have the memory and a controller integrated in the same chip. A storage device may be internal or external to a computer, server or computing device. Examples of storages devices may include, but are not limited to, various types of dynamic random-access memory (DRAM) module such as synchronous DRAM (SDRAM) module and double data rate DRAM (DDR DRAM) module, a flash memory module and a combination thereof. Among them, DDR DRAM has progressed from double data rate 1 (DDR1) through DDR2, DDR3, DDR4, DDR5, etc. Hereinafter, a DDR4 DRAM is used as an example to describe the techniques for controlling the output of the storage device during read operations of the present disclosure. However, the techniques according to various embodiments of the present disclosure may also be implemented with other types of storage devices.

FIG. 1A schematically shows a simplified block diagram of a storage device 1000 according to an embodiment. The storage device 1000 comprises a memory 100 (e.g., DDR4 DRAM 100), a memory controller 200, and an interface 300 for transmitting signals between the memory 100 and the memory controller 200. There are four classes of signals, i.e., clock signals, control signals, address signals and data signals. Only signals when read operations are performed on the memory 100 are shown in FIG. 1A. There may also be other signals such as a reset signal. Hereafter, the term "memory" and the term "DDR4 DRAM" may be used interchangeably. The memory is by no means limited to DDR4 DRAM.

The signals shown in FIG. 1A will be briefly introduced here. The clock signals include true clock CK_t and complement clock CK_c used to provide a differential clock input for internal timing synchronization of the DDR4 DRAM 100. All control and address signals are sampled at the crossing of rising (positive) edges of CK_t and falling (negative) edges of CK_c. The control signals include clock enable CKE, chip select CS, activate command ACT, row address strobe RAS, column address strobe CAS and write enable WE. When CKE is at the high level, internal clock signals are activated. During read operations of the DDR4 DRAM 100, CKE is always at the high level. The entire DDR4 DRAM 100 is enabled when CS is at the low level, and is disabled when CS is at the high level. Thus, CS is always at the low level during the read operations of the DDR4 DRAM 100. When CKE is at the high level, and CS is at the low level, ACT, RAS, CAS and WE together form a command signal set of the DDR4 DRAM 100 for selecting commands such as read, write, activate and refresh commands. For example, when ACT is at the high level, RAS is at the high level, CAS is at the low level, and WE is at the high level, a read command is selected; and when ACT is at the high level, RAS is at the high level, CAS is at the low level, and WE is the low level, a write command is selected. The address signals include bank group address BG and bank address BA. BG and BA are used to provide a physical address of data to be read from/written to the DDR4 DRAM 100. The data signals include data signal DQ and data strobe signals DQS_t and DQS_c. During the read operations of the DDR DRAM 100, a differential signal of DQS_t and DQS_c is used to sample DQ, and DQS_t and DQS_c toggle differentially when DQ is transmitted. The differential signal is output from a differential receiver in the memory controller 200 when DQS_t and DQS_c are at different levels. As can be seen from FIG. 1A, except the data signals, other signals are all unidirectional signals driven by the memory controller 200.

FIG. 1B shows that the memory controller 200 includes the differential receiver, which receives the differential signal of DQS_t and DQS_c. According to an embodiment, and as described in detail below, the memory controller 200 may gate off unwanted portions of the output Rec_O of the differential receiver, for example, using an AND gate.

Figure 2:
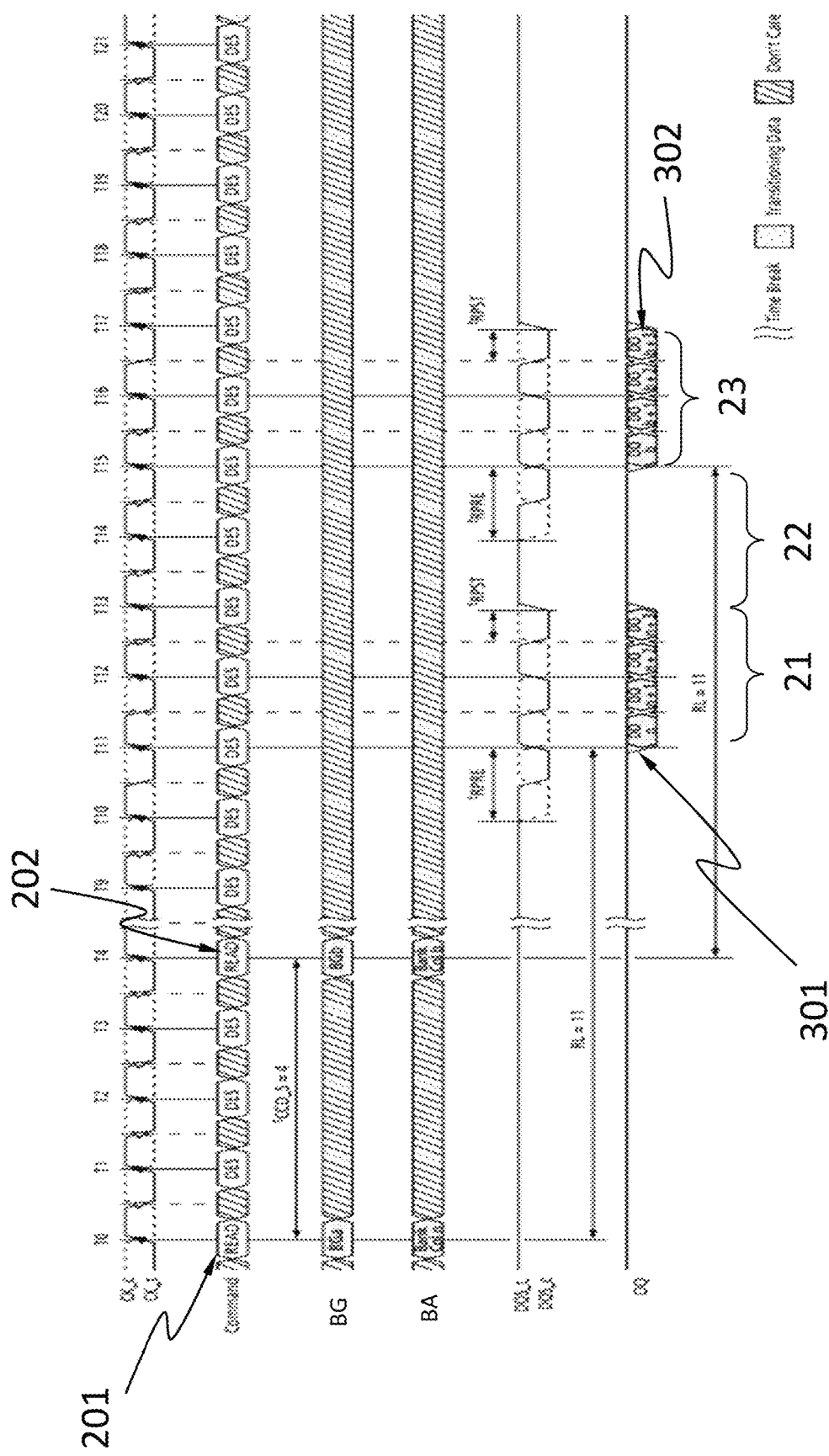
FIG. 2 is a timing diagram of signals used in read operations of a memory of the storage device in FIG. 1A.

FIG. 2 schematically shows a timing diagram of signals used in read operations of the DDR4 DRAM 100 of FIG. 1A according to an embodiment. As shown in the figure, the clock signal CK_t is a periodical square wave signal having a duty cycle of substantially equal to 50%, with a cycle length of T, and the clock signal CK_c is complementary to the clock signal CK_t.

Command, bank group address BG and bank address BA signals are sampled at the crossing of rising edges of CK_t and falling edges of CK_c. Specifically, a first read command 201 and bank group address BG and bank address BA signals (i.e., BGa and Bank Col_n) corresponding to the first read command 201 are sampled at the crossing of rising edge of CK_t and falling edge of CK_c at T0, and a second read command 202 and BG and BA signals (i.e., BGb and Bank Col_b) corresponding to the second read command 202 are sampled at the crossing of rising edge of CK_t and falling edge of CK_c at T4. Thus, a temporal gap $t_{CCD\_S}$ between the first read command 201 and the second command 202 is 4 clock cycles ($t_{CCD\_S}$=4).

The read operations of the DDR4 DRAM 100 are performed in a read burst mode. The read burst mode means that when an initial address is addressed and a read operation is completed, data of continuous addresses after the initial address can be read without re-addressing, which saves time and enhances read performance. Specifically, when the first read command 201 and addresses BGa and Bank Col_n are supplied to the DDR4 DRAM 100, data with a burst length (i.e. data D0n to D0n+3) will be read out in succession from the DDR4 DRAM 100 after a read latency RL (RL=11 in this case) in response to the first read command 201; and when the second read command 202 and addresses BGb and Bank Col_b are supplied to the DDR4 DRAM 100, data with a burst length (i.e. data D0b to D0b+3) will be read out in succession from the DDR4 DRAM 100 after the read latency RL in response to the second read command 202. Herein, the read burst in response to the first read command 201 is referred to as a first read burst 301, and the read burst in response to the second read command 202 is referred to as a second read burst 302. In the example shown in FIG. 2, the length of a temporal gap 22 between the first read burst 301 and the second read burst 302 is 2, and both the length 21 of the first read burst 301 and the length 23 of the second read burst 302 are also 2.

In the DDR4 DRAM 100, a differential signal of data strobe signals DQS_t and DQS_c is used to sample data DQ, and DQS and DQSB toggle differentially when DQ is transmitted. The data strobe signal includes a programmable pre-amble portion with a length represented by $t_{RPRE}$, a data readout period, and a post-amble portion with a length represented by $t_{RPST}$. The data readout period corresponds to a time period located between the pre-amble portion and the post-amble portion. In the example shown in FIG. 2, the length $t_{RPRE}$, also referred to as a pre-amble length, is 1, and the length $t_{RPST}$, also referred to as a post-amble length, is ½. Since the length of the temporal gap 22 between the first read burst 301 and the second read burst 302 is 2, the length of the temporal gap 22 is larger than the pre-amble length $t_{RPRE}$. As shown in FIG. 2, the data strobe signals DQS_t and DQS_c are at the same level in a time period between T13 to T14. Therefore, the differential receiver for outputting the differential signal of data strobe signals DQS_t and DQS_c may have an unknown output during the time period between T13 to T14. Avoiding this unknown output of the differential receiver may avoid disruption of its downstream digital logic.

Figure 3:
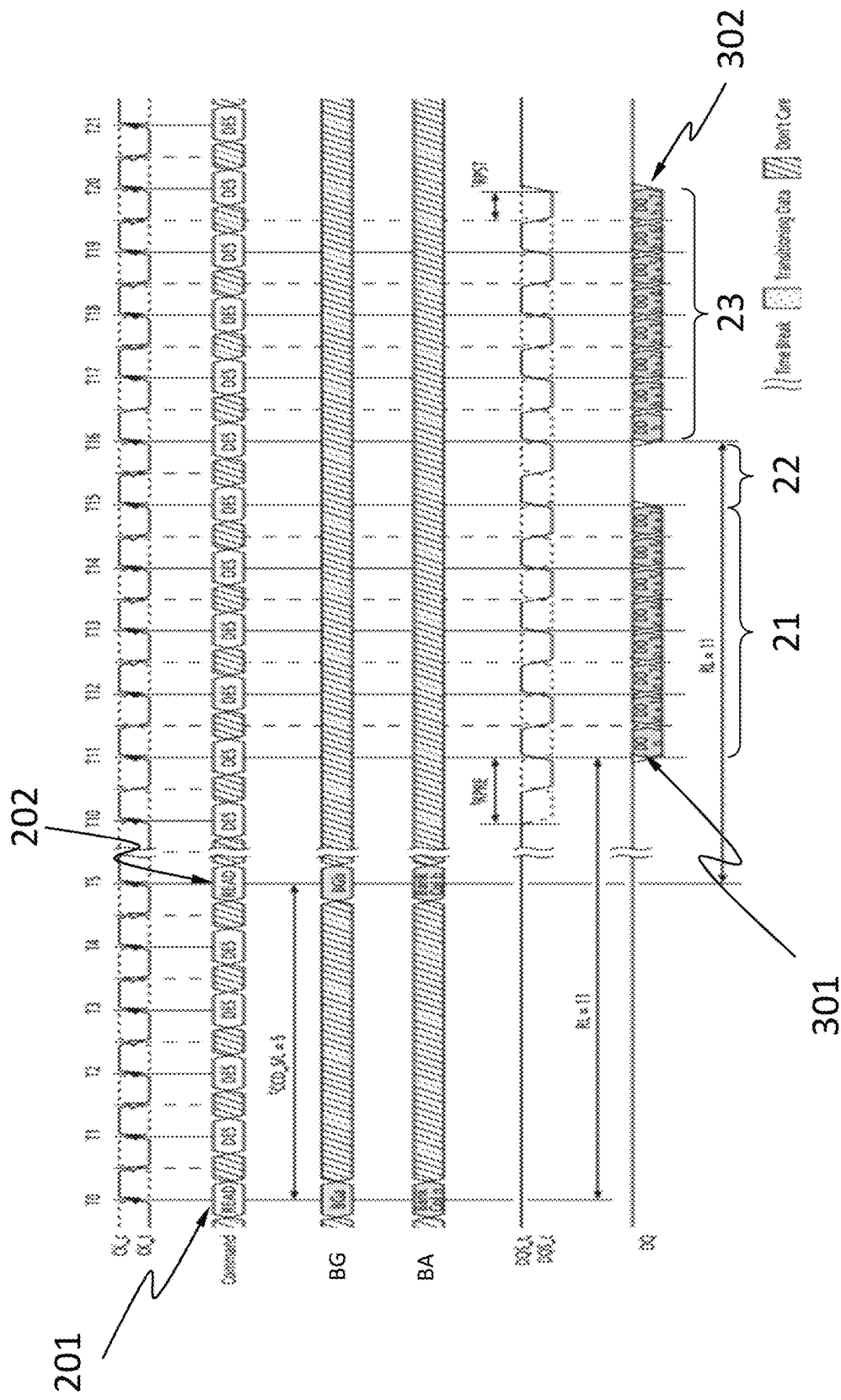
FIG. 3 is a timing diagram of signals used in read operations of the memory of the storage device of FIG. 1A.

FIG. 3 schematically shows a timing diagram of signals used in read operations of the DDR4 DRAM 100 of FIG. 1A according to an embodiment. The difference between the timing diagram of FIG. 3 and that of FIG. 2 is only that some signal parameters have different values, so the detailed description of the same parts will be omitted here to avoid repetition. Specifically, in the example shown in FIG. 3, the temporal gap $t_{CCD\_S/L}$ between the first read command 201 and the second command 202 is 5 ($t_{CCD\_S/L}$=5), the length 21 of the first read burst 301 and the length 23 of the second read burst 302 are each 4, and the length of the temporal gap 22 between the first read burst 301 and the second read burst 302 is 1. Thus, the length of the temporal gap 22 is equal to the pre-amble length $t_{RPRE}$. As shown in FIG. 3, the data strobe signals DQS_t and DQS_c always toggle differentially from the start of the first read burst 301 to the end of the second read burst 302. However, there is still pre-amble toggling during the temporal gap 22 between the first read burst 301 and the second read burst 302. Blocking the output of the differential receiver during the temporal gap 22 may simplify the downstream digital logic.

Figure 4:
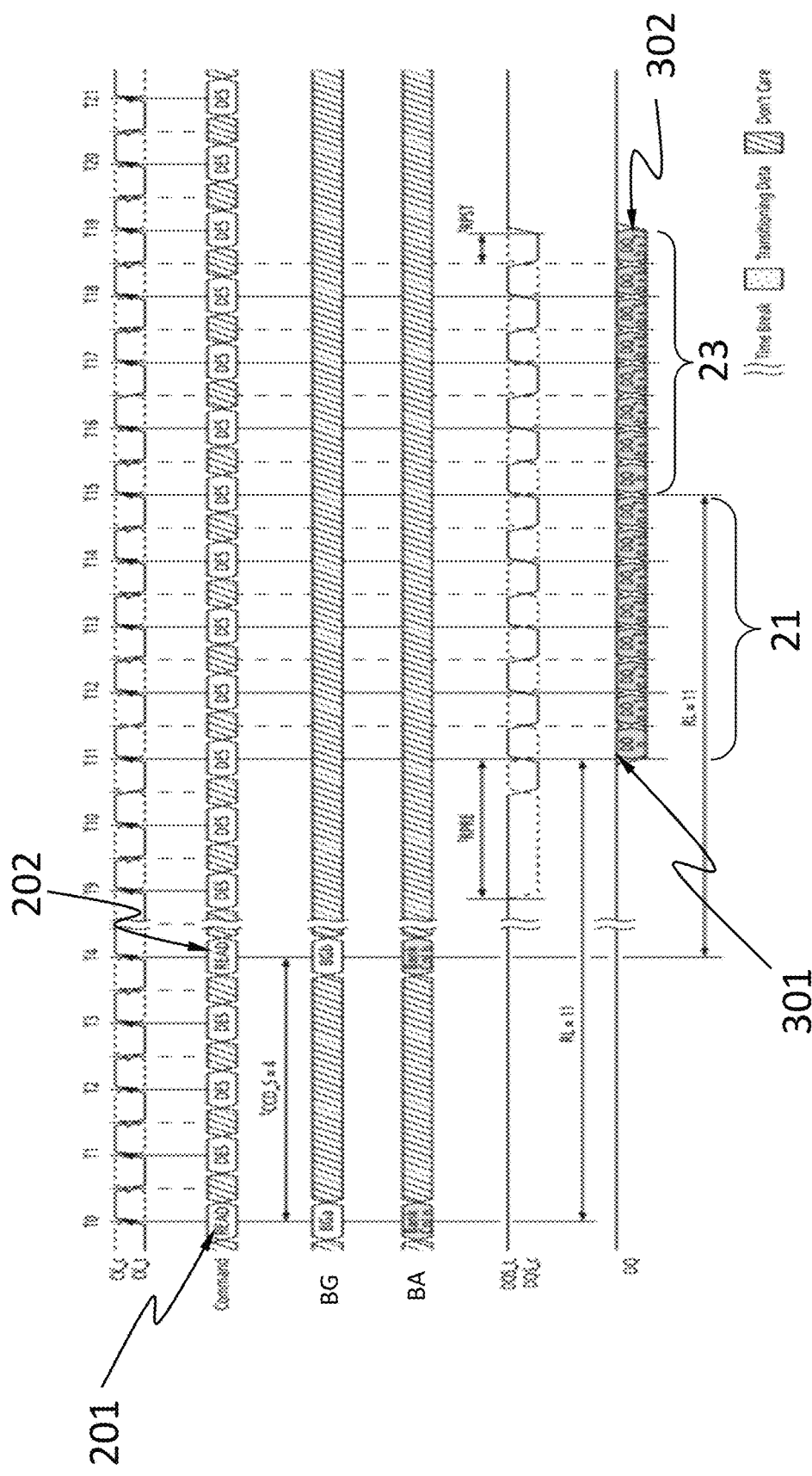
FIG. 4 is a timing diagram of signals used in read operations of the memory of the storage device of FIG. 1A.

FIG. 4 schematically shows a timing diagram of signals used in read operations of the DDR4 DRAM 100 of FIG. 1A according to an embodiment. The difference between the timing diagram of FIG. 4 and that of FIG. 2 is only that some signal parameters have different values, so the detailed description of the same parts will be omitted here to avoid repetition. Specifically, in the example shown in FIG. 4, the pre-amble length $t_{RPRE}$ is 2, the length 21 of the first read burst 301 and the length 23 of the second read burst 302 are both 4, and the length of the temporal gap 22 between the first read burst 301 and the second read burst 302 is 0. As shown in FIG. 4, the data strobe signals DQS_t and DQS_c always toggle differentially from the start of the first read burst 301 to the end of the second read burst 302. Moreover, since the temporal gap 22 between the first read burst 301 and the second read burst 302 is 0, there is no pre-amble toggling between the first read burst 301 and the second read burst 302. Therefore, in this embodiment, there is no need to specially control the output of the differential receiver.

Figure 5:
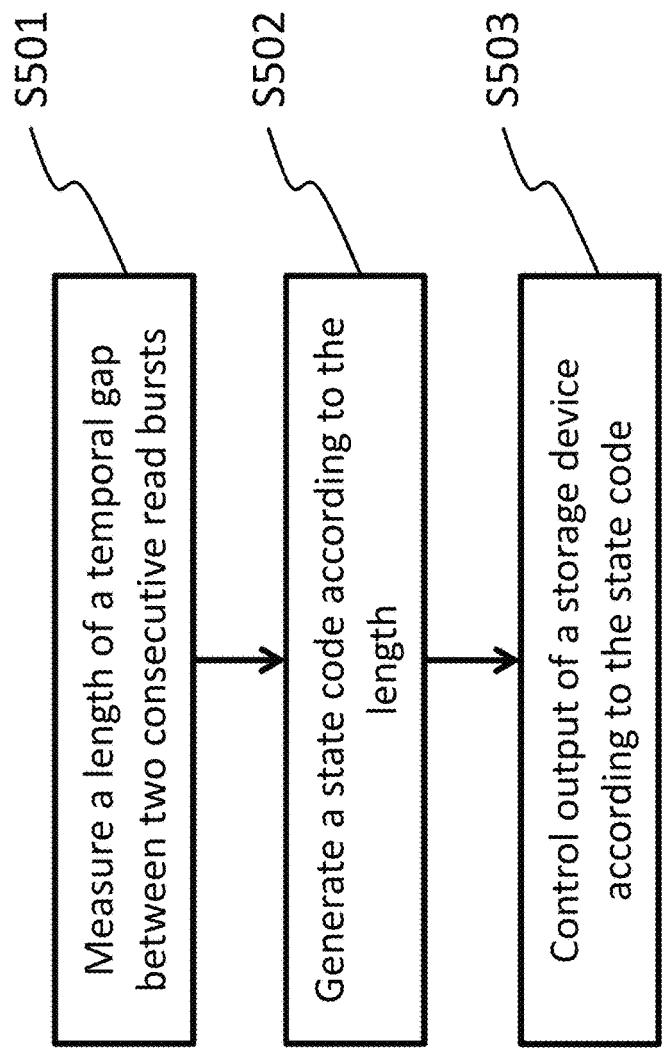
FIG. 5 is a flowchart of a method for controlling output of a storage device during read operations according to an embodiment.

The embodiments shown in FIG. 2-FIG. 4 represent three different scenarios where the output of the differential receiver in the memory controller 200 may need to be controlled. In view of these scenarios, an aspect of the present disclosure provides a method 500 for controlling the output of a storage device during read operations. The method not only is able to gate off unwanted portions of the output of the differential receiver, but also supports different DRAM protocols with different pre-amble and post-amble patterns. As shown in FIG. 5, the method 500 comprises steps S501 to S503, which will be described in detail below.

At step S501, a length of a temporal gap between a first read burst and a second read burst is measured, wherein the first read burst and the second read burst are consecutive (i.e., there are no other read bursts between the first read burst and the second read burst). The first read burst is in response to a first read command received by the DDR4 DRAM 100, and the second read burst is in response to a second read command received by the DDR4 DRAM 100. Specifically, the first read burst refers to a process of reading data with a first burst length in succession from the DDR4 DRAM 100 after a read latency in response to the first read command, and the second read burst refers to a process of reading data with a second burst length in succession from the DDR4 DRAM 100 after a read latency in response to the second read command.

As an example, for Scenario 1 shown in FIG. 2, the first read burst corresponds to reading data D0n to D0n+3 from the DDR DRAM 100 during T11 to T13, the second read burst corresponds to reading data D0b to D0b+3 from the DDR DRAM 100 during T15 to T17, and the length of the temporal gap is 2. As another example, for Scenario 2 shown in FIG. 3, the first read burst corresponds to reading data D0n to D0n+7 from the DDR DRAM 100 during T11 to T15, the second read burst corresponds to reading data D0b to D0b+7 from the DDR DRAM 100 during T16 to T20, and the length of the temporal gap is 1. As a yet another example, for Scenario 3 shown in FIG. 4, the first read burst corresponds to reading data D0n to D0n+7 from the DDR DRAM 100 during T11 to T15, the second read burst corresponds to reading data D0b to D0b+7 from the DDR DRAM 100 during T16 to T20, and the length of the temporal gap is 1.

In an embodiment, the method 500 may further comprise a step of determining a temporal gap between the first read command and the second read command before step S501. Then, in step S501, the length of the temporal gap between the first read burst and the second read burst is measured based on the temporal gap between the first read command and the second read command. Each read command includes a burst length with an initial address and other standard parameters. For example, the first read command includes the first burst length, and the second read command includes the second burst length. In an embodiment, the length of the temporal gap between the first read burst and the second read burst may be obtained by subtracting the first burst length from the temporal gap between the first read command and the second read command. For example, in Scenario 1 of FIG. 2, the temporal gap $t_{CCD\_s}$ between the first read command and the second read command is 4, and the first burst length is 2, so the length of the temporal gap 22 between the first read burst and the second read burst is 2 (=4−2). For another example, in Scenario 2 of FIG. 3, the temporal gap $t_{CCD\_S/L}$ between the first read command and the second read command is 5, and the first burst length is 4, so the length of the temporal gap 22 between the first read burst and the second read burst is 1 (=5−4). For a yet another example, in Scenario 3 of FIG. 4, the temporal gap $t_{CCD\_S}$ between the first read command and the second read command is 4, and the first burst length is 4, so the length of the temporal gap 22 between the first read burst and the second read burst is 0 (=4−4).

At step S502, a state code is generated according to the length of the temporal gap determined in step S501. In the present disclosure, the state code is set to have 3 different values for different lengths of the temporal gap. Specifically, the state code has a first value when the length is zero, a second value when the length is equal to or shorter than a threshold time length but is non-zero, and a third value when the length is greater than the threshold time length. In an embodiment, the threshold time length may be set as the pre-amble length. For example, for scenarios 1 and 3 mentioned above, the threshold time length may be 4, and for scenario 2 mentioned above, the threshold time length may be 5. In addition, in an embodiment, the first value may be set to 3, the second value may be set to 2, and the third value may be set to 1. It should be noted that the first, second and third values may also be any other values as long as they are different from each other.

Figure 6:
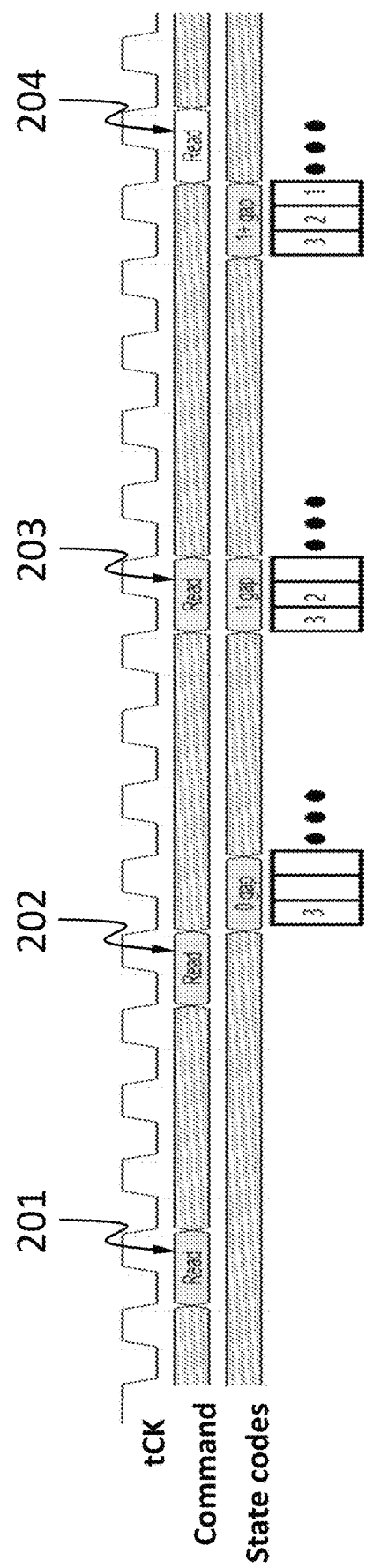
FIG. 6 is a timing diagram of generating a state code according to an embodiment.
Figure 7:
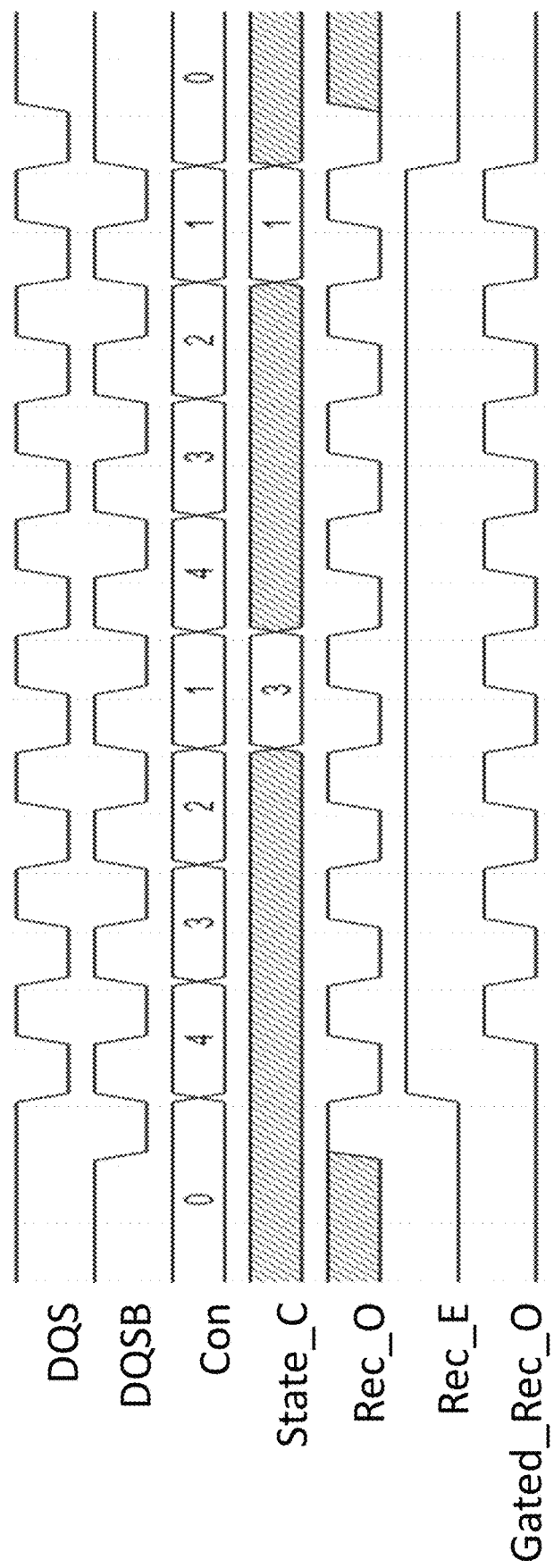
FIG. 7 is a timing diagram of signals used for controlling output of a differential receiver according to an embodiment.
Figure 8:
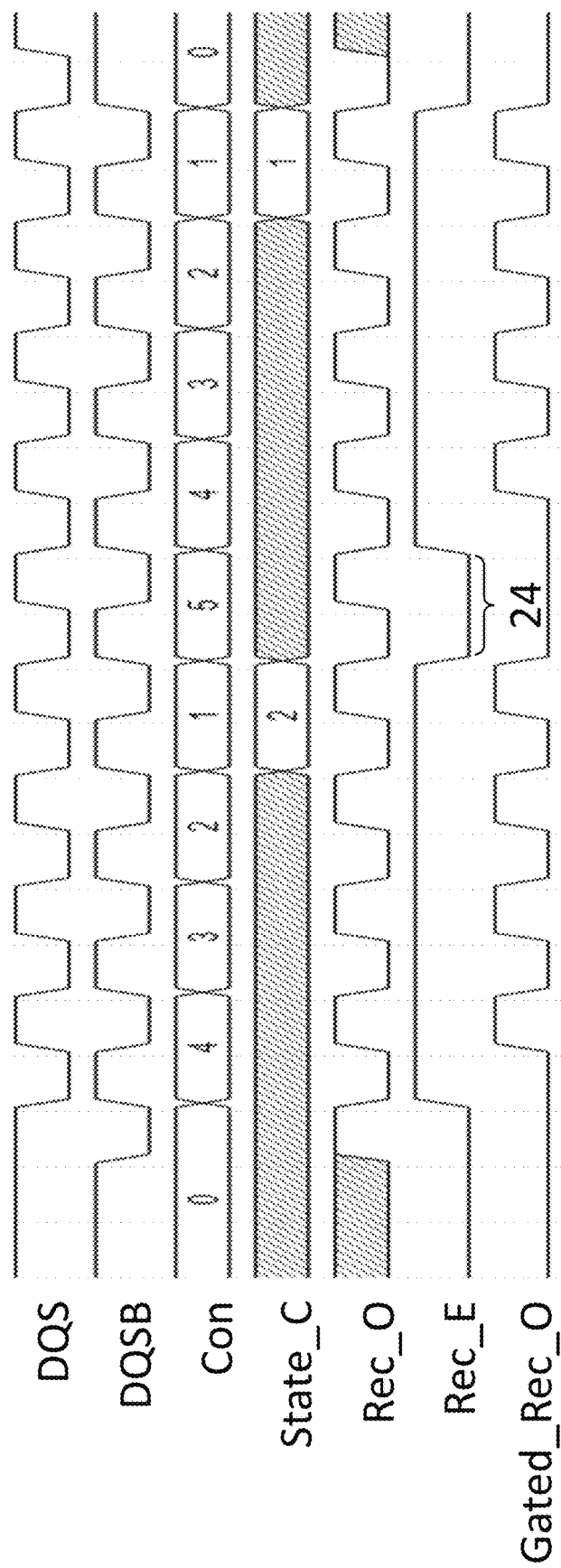
FIG. 8 is a timing diagram of signals used for controlling output of a differential receiver according to an embodiment.
Figure 9:
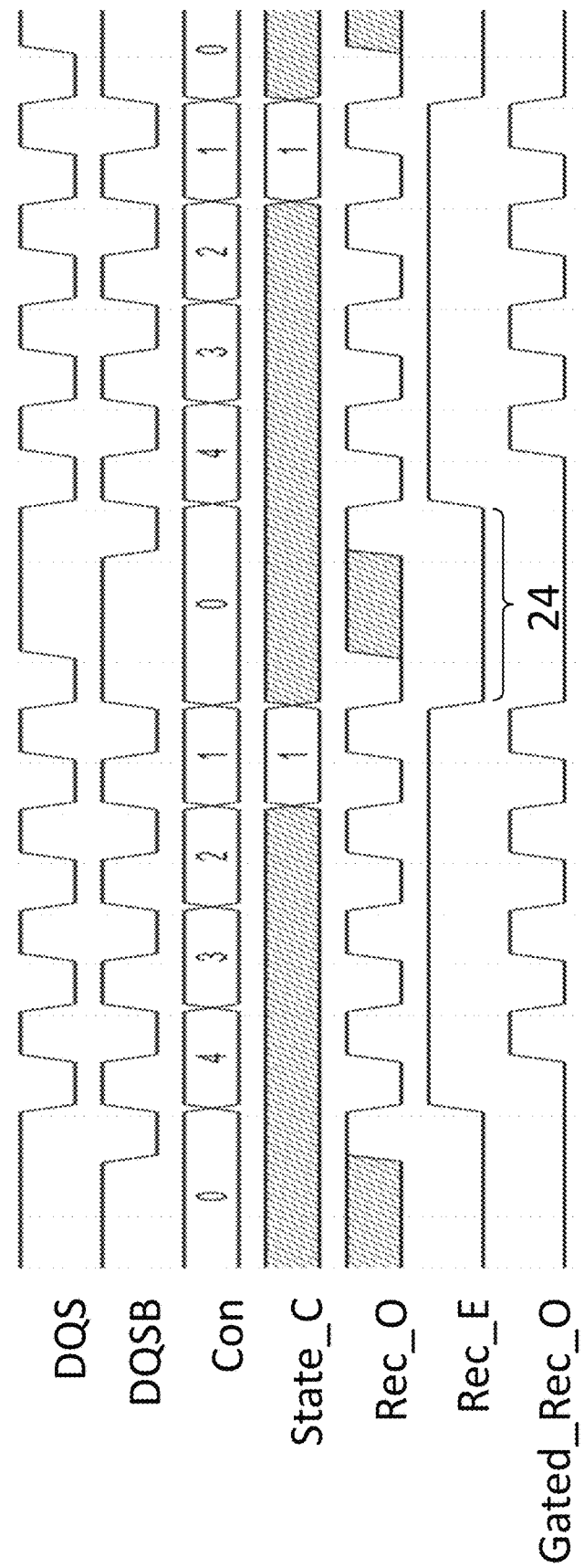
FIG. 9 is a timing diagram of signals used for controlling output of a differential receiver according to an embodiment.
Figure 10:
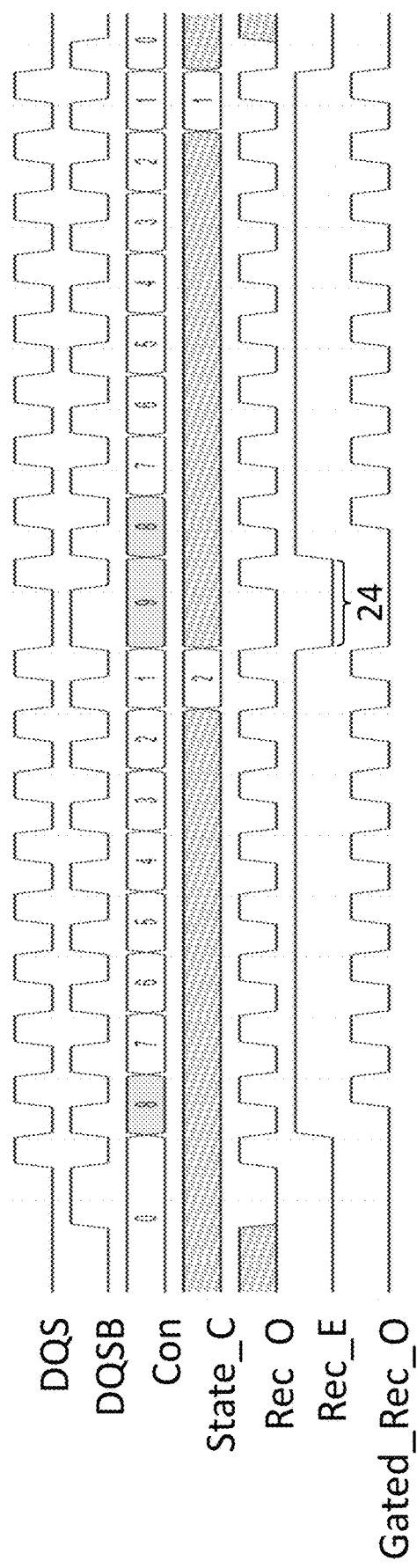
FIG. 10 is a timing diagram of signals used for controlling output of a differential receiver according to an embodiment.

FIG. 6 schematically shows a timing diagram of generating a state code according to an embodiment. As shown in FIG. 6, after a first read command 201 is issued, it is determined whether a second read command 202 has arrived within the time of minimal gap between two read commands plus a pre-amble length. If the second read command 202 has not arrived with the above time, the temporal gap between the first and second read commands 201 and 202 must be larger than the pre-amble length. The minimal gap between two read commands is usually a read burst length, such as 4 or 8 clock cycles. After the second read command 202 arrives and before a first read burst in response to the first read command arrives, a temporal gap between two read bursts in response to the first and second read commands 201 and 202 is determined, and a state code representing the temporal gap between the two read bursts is correspondingly generated.

In this embodiment, when the temporal gap between the two read bursts is zero, a state code of 3 is generated; when the temporal gap between the two read bursts is equal to or less than the pre-amble length and non-zero, a state code of 2 is generated; and when the temporal gap between the two read bursts is larger than the pre-amble length, a state code of 1 is generated. Then, the state code is enqueued into a queue (for example, pushing to a FIFO). For subsequent read commands 203 and 204, etc., the state codes are generated and enqueued into the queue in a similar way.

Since the pre-amble length in this embodiment is assumed to be 1 clock cycle, the state code of 3 is generated for 0 gap, the state code of 2 is generated to for 1 gap (i.e., 1 clock cycle gap), and the state code of 3 is generated for +1 gap (i.e., more than 1 clock cycle gap), as show in FIG. 6. Although the state codes of 3, 2 and 1 are generated for three different gaps in this embodiment, the states codes may adopt any other values as long as they are different from one another. Therefore, the present disclosure is not limited to the values 3, 2 and 1.

At step S503, the output of the storage device is controlled according to the state code generated in Step S502. In one embodiment, a time period may be determined according to the state code, and then the output of the differential receiver of the storage device may be set to a fixed value during the time period, wherein the time period is between the first read burst and the second read burst. For example, the output of the differential receiver may be set to a fixed low level through disabling the output of the differential receiver.

Figure 11:
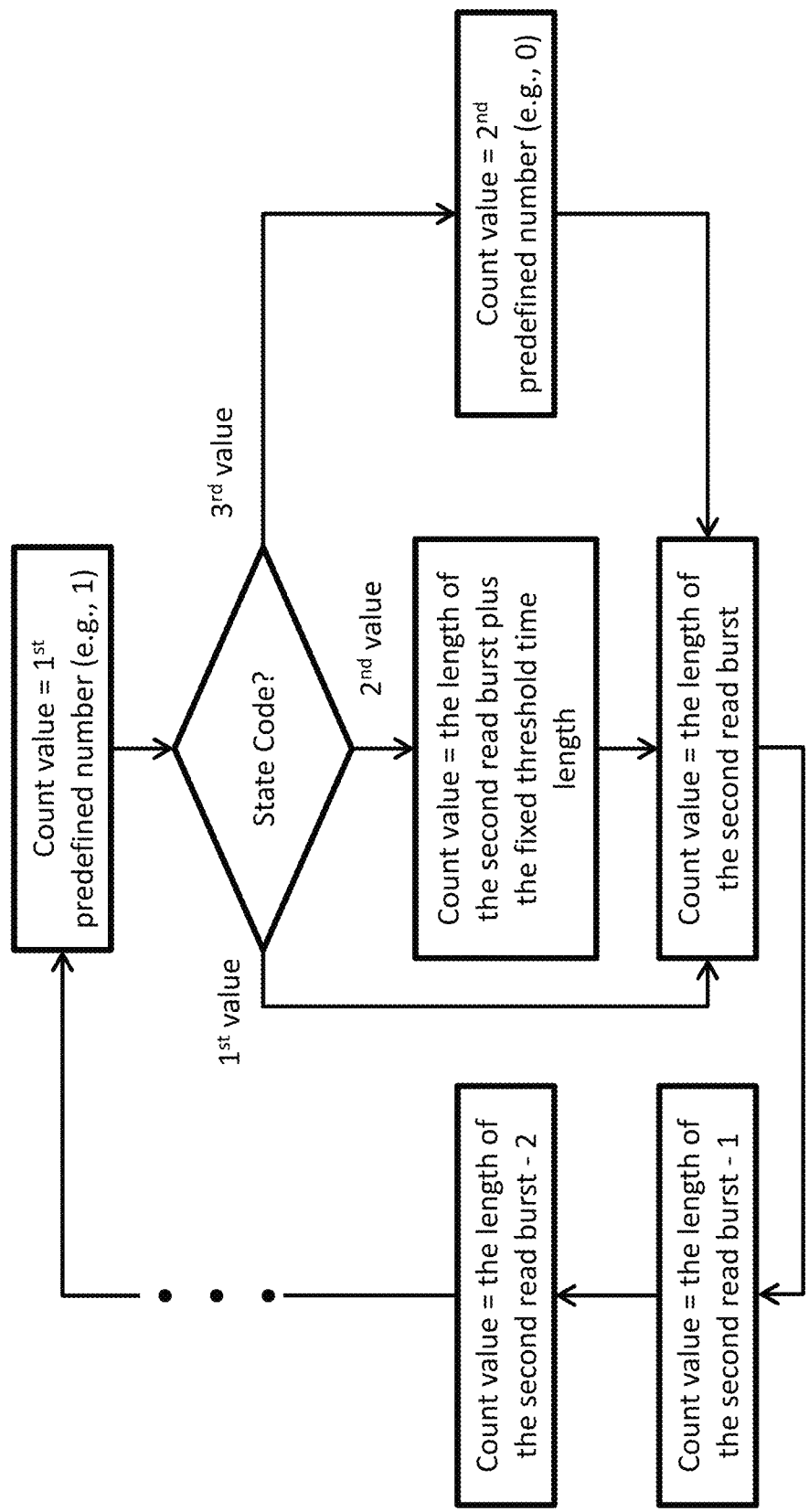
FIG. 11 shows changes of a count value based on a state code, according to an embodiment.

In an embodiment, a time period may be determined according to the state code, and then output of a differential receiver in the storage device may be controlled according to the state code. In this embodiment, a counter may be used to count the time period determined according to the state code. Specifically, at each toggling of an input of the differential receiver, the counter is set to a next count value based on the state code and a current count value of the counter. In an example, (A) the next count value is a length of the second read burst when the current count value is a first predefined number and the state code has the first value; (B) the next count value is the length of the second read burst plus the fixed threshold time length when the current count value is the first predefined number and the state code has the second value; (C) the next count value is a second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number. In this example, the time period begins at the end of the first read burst and ends when the next count value is not greater than the length of the second read burst and does not equal the second predefined number. The step may be 1, but may also be any other positive value. FIG. 11 shows how the count value changes based on the state code, as described above.

Next, in order to further explain step S503, examples (Examples A to D) of controlling output of a differential receiver of a DDR DRAM using the combination of the counter and the state code will be described in detail with reference to FIG. 7-FIG. 10. FIG. 7-FIG. 10 schematically show timing diagrams of data strobe signals DQS and DQSB, the value Con of the counter, state codes Sate_C, receiver output Rec_O, receiver enable Rec_E and gated receiver output Gated_Rec_O in Examples A to D, respectively.

With regard to Examples A to C, the read burst length is 4. The counter is initialized as 0, and the counter value is then changed to 4 upon the toggling of DQS during the pre-amble portion. Next, the counter value decreases by 1 upon the toggling of Rec_O. When the counter value reaches 1, the state code is dequeued from a queue. Then, the next value of counter is determined based on the value of the state code. Specifically, in Example A, the value of the state code is 3, that is, there is no temporal gap between two consecutive read bursts, and the next value of the counter is changed to 4. In Example B, the value of the state code is 2, that is, the temporal gap between two consecutive read bursts is equal to or less than the pre-amble length but non-zero, and the next value of the counter is changed to 5 due to one extra count for the pre-amble toggling of the second read burst. In Example C, the value of the state code is 1, that is, the temporal gap between two consecutive read bursts is larger than the pre-amble length, and the next value of the counter is changed to 0. When the counter value is larger than 4 or equals to 0, Rec_E is set to the low level so that the output of the differential receiver is gated off. For example, in FIGS. 8 and 9, during the time period denoted by 24, the output of the differential receiver is gated off. Specifically, the output of the differential receiver is set to the low level during the time period.

With regard to Example D, unlike Examples A to C, the read burst length is 8 clock cycles. The counter is also initialized as zero, and the counter value is then changed to 8 upon the toggling of DQS during the pre-amble portion. Next, the counter value decreases by 1 upon the toggling of Rec_O. When the counter value reaches 1, the state code is dequeued from the queue. Then, the next value of counter is determined based on the value of the state code. When the value of the state code is 3, that is, there is no temporal gap between two consecutive read bursts, the next value of the counter is 8. When the value of the state code is 2, that is, the temporal gap between two consecutive read bursts is equal to or less than the pre-amble length but non-zero, the next value of the counter is 9 with the consideration of the pre-amble toggling of the second read burst. When the value of the state code is 1, that is, the temporal gap between two consecutive read bursts is larger than the pre-amble length, and the next value of the counter is 0. When the counter's value is larger than 8 or equals to 0, Rec_E is set to the low level so that the output of the differential receiver is gated off. For example, in FIG. 10, during the time period denoted by 24, the output of the differential receiver is gated off.

An aspect of the present disclosure provides a controller. In an embodiment, the controller is configured to measure a length of a temporal gap between a first read burst and a second read burst from a memory a storage device, wherein the first read burst and the second read burst are consecutive, the first read burst is in response to a first read command received by the memory and the second read burst is in response to a second read command received by the memory. For example, the first read burst and the second read burst are the first read burst 301 and the second read burst 302 shown in FIG. 2, and the length of the temporal gap is the length of the temporal gap 22 shown in FIG. 2.

In an embodiment, the controller is further configured to generate a state code according to the length of the temporal gap, where the state code has a first value when the length is zero, a second value when the length is equal to or shorter than a threshold time length but is non-zero, and a third value when the length is greater than the threshold time length. For example, when the length is zero, a state code of 3 is generated; when the length is equal to or less than 1 (the threshold time length is 1 in this example) and non-zero, a state code of 2 is generated; and when the length is larger than 1, a state code of 1 is generated, as show in FIG. 6.

In an embodiment, the controller is further configured to control output of the storage device according to the state code. In an embodiment, the controller may be configured to set the output of the storage device to a fixed value. In an embodiment, the output may be from a differential receiver in the storage device, and the controller is configured to set the output of the differential receiver to a fixed value. In an embodiment, the output may be from a differential receiver in the storage device, and the controller may be configured to determine a time period according to the state code and set the output of the differential receiver to a fixed value during the time period, wherein the time period is between the first read burst and the second read burst.

Figure 12:
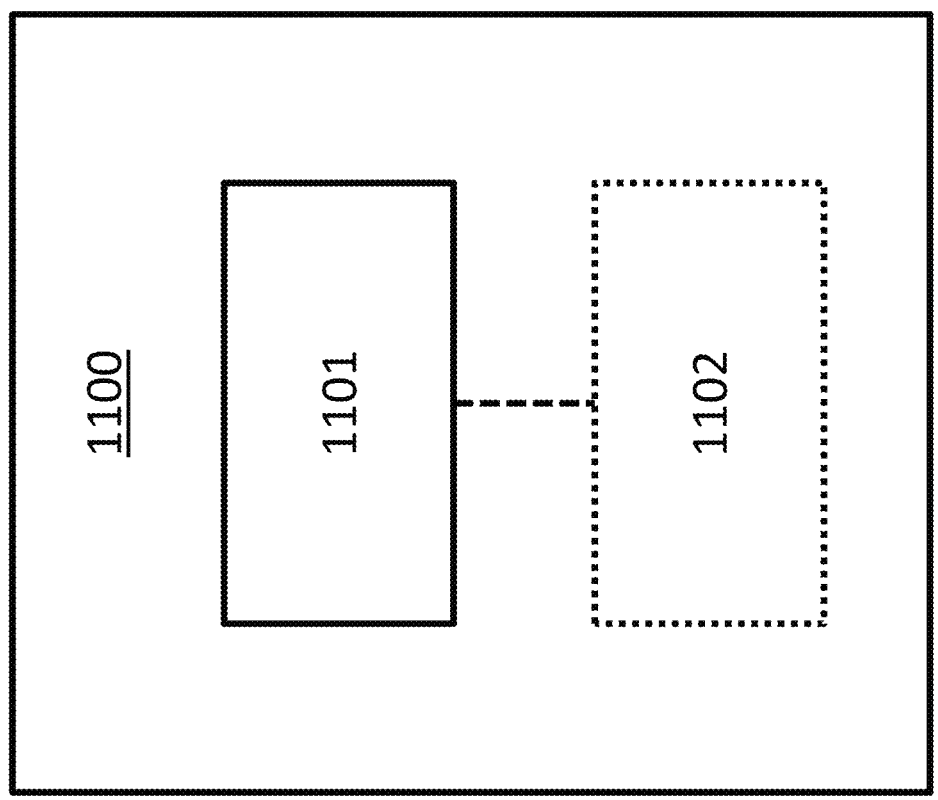
FIG. 12 is a block diagram of a controller according to an embodiment.

In an embodiment, the controller may be a controller 1100 shown in FIG. 12. The controller 1100 comprises logic 1101 and an optional counter 1102. The logic 110 is configured to perform at least one of the following operations: measuring a length of a temporal gap between a first read burst and a second read burst from a memory of a storage device; generating a state code according to the length; determining a time period according to the state code; at each toggling of an input of a differential receiver in the storage device, setting the counter to a next count value based on the state code and a current count value of the counter; and controlling output of the differential receiver according to the state code. Such logic may be implemented by hardware, firmware, software, or a combination thereof.

The counter 1102 is configured to count the time period, wherein the time period begins at the end of the first read burst and ends when the next count value is not greater than a length of the second read burst and does not equal a second predefined number. In an embodiment, the next count value of the counter is determined based on the state code and the current count value of the counter in such a manner that (A) the next count value is the length of the second read burst when the current count value is a first predefined number and the state code has the first value; (B) the next count value is the length of the second read burst plus the fixed threshold time length when the current count value is the first predefined number and the state code has the second value; (C) the next count value is the second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number. For example, the first predefined number may be 1, and the second predefined number may be 0. Meanwhile, it should be noted that the step mentioned in (E) is preferably 1, but it may also be any other positive values.

An aspect of the present disclosure provides a system 1200. As shown in FIG. 13, the system 1200 comprises a controller 1100. The controller 1100 may be any one of the controllers in various embodiments described above. For example, the system 1200 may be a solid-state drive (SSD), a flash drive, a mother board, a processor, a computer, a server, a gaming device, or a mobile device.

An aspect of the present disclosure provides a non-transitory machine-readable medium. The non-transitory machine-readable medium stores information, which when read by a hardware processor system, causes the hardware processor system to perform any one of the methods in various embodiments described above. The machine-readable medium may be a computer-readable medium, a processor-readable medium, or a computer usable medium having a computer-readable program code embodied therein. It could be understood by those of ordinary skill in the art that other instructions and data necessary to implement the above embodiments may also be stored on the machine-readable medium. The instructions stored on the machine-readable medium can be executed by the hardware processor system to implement corresponding operations or tasks.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   measuring a length of a temporal gap between a first read burst and a second read burst from a memory of a storage device, wherein the first read burst and the second read burst are consecutive, the first read burst is in response to a first read command received by the memory and the second read burst is in response to a second read command received by the memory;
   generating a state code according to the length, wherein the state code has a first value when the length is zero, a second value when the length is equal to or shorter than a threshold time length but is non-zero, and a third value when the length is greater than the threshold time length; and
   controlling output of a differential receiver in the storage device according to the state code by setting the output to a fixed value;
   determining a time period according to the state code and setting the output to the fixed value during the time period; wherein the time period is between the first read burst and the second read burst;
   at each toggling of an input of the differential receiver, setting a counter to a next count value based on the state code and a current count value of the counter;
   wherein (A) the next count value is a length of the second read burst when the current count value is a first predefined number and the state code has the first value; (B) the next count value is the length of the second read burst plus the fixed threshold time length when the current count value is the first predefined number and the state code has the second value; (C) the next count value is a second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number;
   wherein the time period begins at the end of the first read burst and ends when the next count value is not greater than the length of the second read burst and does not equal the second predefined number.

2. The method of claim 1, wherein the output is from a differential receiver in the storage device.

3. The method of claim 1, wherein the length is measured based on a temporal gap between the first read command and the second read command.

4. The method of claim 1, further comprising enqueuing the state code into a queue.

5. The method of claim 4, further comprising dequeuing the state code from the queue after controlling the output of the storage device according to the state code.

6. The method of claim 1, wherein the memory is a flash memory or a dynamic random-access memory (DRAM).

7. The method of claim 1, wherein the length of the second read burst is 4 clock cycles or 8 clock cycles.

8. The method of claim 1, wherein the fixed threshold time length is 1 clock cycle.

9. The method of claim 1, wherein the first predefined number is 1 and the second predefined number is 0.

10. A controller, configured to:
    measure a length of a temporal gap between a first read burst and a second read burst from a memory of a storage device, wherein the first read burst and the second read burst are consecutive, the first read burst is in response to a first read command received by the memory and the second read burst is in response to a second read command received by the memory;
    generate a state code according to the length, wherein the state code has a first value when the length is zero, a second value when the length is equal to or shorter than a threshold time length but is non-zero, and a third value when the length is greater than the threshold time length; and
    control output of a differential receiver in the storage device according to the state code;
    wherein the controller comprises a counter configured to count the time period, the output is from a differential receiver in the storage device, and the controller is further configured to: at each toggling of an input of the differential receiver, set the counter to a next count value based on the state code and a current count value of the counter,
    wherein (A) the next count value is a length of the second read burst when the current count value is a first predefined number and the state code has the first value; (B) the next count value is the length of the second read burst plus the fixed threshold time length when the current count value is the first predefined number and the state code has the second value; (C) the next count value is a second predefined number when the current count value is the first predefined number and the state code has the third value; (D) the next count value is the length of the second read burst when the current count value is the second predefined number; and (E) the next count value is the current count value minus a step, when the current count value is neither the first predefined number nor the second predefined number;
    wherein the time period begins at the end of the first read burst and ends when the next count value is not greater than the length of the second read burst and does not equal the second predefined number.

11. The controller of claim 10, wherein the controller is further configured to set the output to a fixed value.

12. The controller of claim 10, wherein the controller is further configured to determine a time period according to the state code and set the output to the fixed value during the time period; wherein the time period is between the first read burst and the second read burst.

13. A system comprising the controller of claim 10, wherein the system is a solid-state drive (SSD), a flash drive, a mother board, a processor, a computer, a server, a gaming device, or a mobile device.

14. A non-transitory machine-readable medium, having information recorded thereon, wherein the information, when read by a hardware processor system, causes the hardware processor system to perform the method of claim 1.

* * * * *